United States Patent [19]

Maternaghan

[11] Patent Number: 5,496,485
[45] Date of Patent: Mar. 5, 1996

[54] ETCHING COMPOSITIONS

[75] Inventor: David S. Maternaghan, Ilkeston, Great Britain

[73] Assignee: Micro-Image Technology Limited, London, England

[21] Appl. No.: 325,333

[22] PCT Filed: May 17, 1993

[86] PCT No.: PCT/GB93/01003

§ 371 Date: Dec. 19, 1994

§ 102(e) Date: Dec. 19, 1994

[87] PCT Pub. No.: WO93/23493

PCT Pub. Date: Nov. 25, 1993

[30] Foreign Application Priority Data

May 16, 1992 [GB] United Kingdom ............... 9210514

[51] Int. Cl.$^6$ .................................................. C09K 13/00
[52] U.S. Cl. ........................................ 252/79.3; 252/79.4
[58] Field of Search ............................ 252/79.4, 79.3, 252/79.2; 156/662; 134/3

[56] References Cited

U.S. PATENT DOCUMENTS

| | | | |
|---|---|---|---|
| 3,773,577 | 11/1973 | Shibasaki et al. | 252/79.4 X |
| 3,935,118 | 1/1976 | Czirr et al. | 252/79.4 |
| 4,795,582 | 1/1989 | Ohmi et al. | 252/79.4 |
| 4,826,565 | 5/1989 | Suzuki et al. | 252/79.4 |
| 5,277,835 | 1/1994 | Ohmi et al. | 252/79.4 X |
| 5,387,361 | 2/1995 | Kohara et al. | 252/79.4 X |

*Primary Examiner*—Thi Dang
*Attorney, Agent, or Firm*—Marshall, O'Toole, Gerstein, Murray & Borun

[57] ABSTRACT

An aqueous composition for etching and cleaning semiconductor devices comprises a solution of an acid and a surfactant which is a branched chain aliphatic amine having the formula $C_mH_{2m+3}N$, where m is an integer from 7 to 10. The compositions are stable for long periods of time and do not suffer foaming problems when used in recirculation filtration systems.

14 Claims, No Drawings

ETCHING COMPOSITIONS

This invention is concerned with etching compositions useful in the fabrication of semiconductor devices. More particularly, this invention concerns etching compositions containing an amine surfactant.

Historically, compositions comprising ammonium fluoride, hydrofluoric acid and de-ionised water have been used for etching and cleaning substrates at various process stages during the fabrication of semiconductor devices. As device geometries have decreased, making them more sensitive to process deviation and contamination, it has become essential for etch uniformity to be enhanced and contamination reduced.

It is difficult to define structures below five microns in size using the above wet etching compositions due to their nonuniform etching properties. This problem is related to the physical wetting of the low surface energy substrates used, e.g. photoresists. Mixtures of ammonium fluoride and hydrofluoric acid typically exhibit relatively high surface tension properties of approximately 80–90 dynes/cm at 25° C. (higher concentration ammonium fluoride mixtures exhibit even higher surface tensions). The result of this property is the inability of the mixture to penetrate small geometries and uniformly etch the substrate. For ammonium fluoride and hydrofluoric acid mixtures to be useful for etching small geometries, it is necessary to modify their surface wetting properties.

Semiconductor manufacturers presently utilise two methods to improve surface wetting and etch uniformity. The first involves the use of an acid pre-dip solution comprising a surfactant in de-ionised water. The second involves the direct addition of a surfactant into the acid etch bath.

The pre-dip process, however, results in regular changes of the acid etchant due to carry-over of the pre-dip solution into the etch bath which subsequently causes dilution, resulting in etch variation.

The addition of a surfactant directly to the etch bath also suffers problems related to the solubility of the surfactant in the highly ionic environment exhibited by the ammonium fluoride/hydrofluoric acid mixtures. This is detected as a visual clouding of the etch tank solution caused by the surfactant remaining in suspension. This problem becomes more apparent as the industry moves from stagnant to recirculating-filtration tanks in an effort to reduce particle contamination. The surfactants which are not entirely soluble in the mixtures tend to be removed by the filtering system, resulting in a detrimental increase in the surface tension of the mixtures.

Many attempts to provide stable aqueous solutions of ammonium fluoride, hydrofluoric acid and surfactant have been made. For example, it is disclosed in U.S. Pat. No. 4,517,106 to add a fluoroalkylsulfonate to improve the wetting properties of the acid solutions. U.S. Pat. No. 4,761,245 discloses addition of a nonionic alkylphenol polyglycidol for the same purpose. There are many other examples.

In U.S. Pat. No. 4,795,582, it is disclosed that surfactants selected from the group consisting of aliphatic carboxylic acids and salts thereof, aliphatic amines and aliphatic alcohols may be added to aqueous mixtures of ammonium fluoride and hydrofluoric acid to improve surface wetting. Whilst a number of different compounds, including octylamine, are exemplified in the U.S. patent as being suitable surfactants, no preference is expressed. In a recirculation-filtration tank comprising an aqueous solution of ammonium fluoride, hydrofluoric acid and octylamine surfactant it was noted that a significant build-up of foam occurred, which could have detrimental effects such as staining of the substrate or inhibition of the etch process.

It is an object of the present invention to provide etchant compositions which do not suffer significant foam problems. It is a further object of the present invention to provide etchant compositions which are stable solutions.

In accordance with the present invention, there is provided an aqueous composition for etching and cleaning semiconductor devices comprising at least one acid, which acid may be organic or inorganic, and a surfactant, characterised in that the composition comprises from 100 ppm to 2000 ppm, e.g. 150 ppm to 1500 ppm, preferably 250 ppm to 1600 ppm, e.g. 250 ppm to 1200 ppm, of a surfactant which is a branched chain aliphatic amine having the formula $C_mH_{2m+3}N$, where m is an integer from 7 to 10.

In accordance with one preferred embodiment of the present invention, there is provided an aqueous composition for etching and cleaning semiconductor devices comprising a solution of ammonium fluoride, hydrogen fluoride and a surfactant characterised in that the composition comprises 15% to 40% by wt ammonium fluoride, 0.5% to 11% by wt hydrogen fluoride and 100 ppm to 2000 ppm, e.g. 150 ppm to 1500 ppm, preferably 250 ppm to 1600 ppm, e.g. 250 ppm to 1200 ppm, of a surfactant which is a branched chain aliphatic amine having the formula $C_mH_{2+3}N$, where m is an integer from 7 to 10.

In accordance with another preferred embodiment of the present invention, there is provided an aqueous composition for etching and cleaning semiconductor devices comprising a solution of phosphoric acid and a surfactant characterised in that the composition comprises 60% to 80% by wt phosphoric acid and 100 ppm to 2000 ppm, e.g. 150 ppm to 1500 ppm, preferably 250 ppm to 1600 ppm, e.g. 250 ppm to 1200 ppm, of a surfactant which is a branched chain aliphatic amine having the formula $C_mH_{2m+3}N$, where m is an integer from 7 to 10, and optionally one or more of nitric acid, in an amount of up to 6% by wt, acetic acid, in an amount of up to 15% by wt, and hydrofluoric acid, in an amount of up to 5% by wt.

In accordance with yet another preferred embodiment of the present invention, there is provided an aqueous composition for etching and cleaning semiconductor devices comprising a solution of ammonium fluoride, acetic acid and a surfactant characterised in that the composition comprises 15% to 75% by wt ammonium fluoride, 10% to 35% by wt acetic acid and 100 ppm to 2000 ppm, e.g. 150 ppm to 1500 ppm, preferably 250 ppm to 1600 ppm, e.g. 250 ppm to 1200 ppm, of a surfactant which is a branched chain aliphatic amine having the formula $C_mH_{2m+3}N$, where m is an integer from 7 to 10, and optionally hydrofluoric acid, in an amount of up to 5% by wt.

Preferably, the branched chain aliphatic amine is a primary, secondary or tertiary amine having the formula $C_8H_9N$. More preferably, the branched chain aliphatic amine is 1-methylheptylamine, 2-ethylhexylamine, dibutylamine, 1,5-dimethyl hexylamine or N,N-diisopropylethylamine or a mixture thereof. Most preferably, the branched chain aliphatic amine is 2-ethylhexylamine.

Surprisingly, the compositions of the present invention are stable over long periods of time (branched chain hydrocarbons tend to be unstable in highly acidic environments) and, when used in recirculation filtration tanks, produce little or no foam.

Preferably, the compositions of the present invention contain no compounds in addition to those described above.

The compositions of the present invention are suitable for etching or cleaning semiconductor devices and are particulary suitable for etching oxide films formed on the surface of silicon.

In another aspect, the present invention provides the use of the above branched chain aliphatic amines as surfactants in aqueous etchant compositions.

The invention will now be illustrated, without limitation, with reference to the following examples.

In the following examples, a surfactant was added to a mixture of predetermined amounts of hydrofluoric acid, ammonium fluoride and deionised water to prepare an etchant composition. The prepared composition was kept standing at room temperature and test samples were periodically withdrawn to monitor the change of surface tension of the composition. The surface tension was measured using a Du Nouy ring tensiometer at 25° C. A ring of platinum/iridium alloy is immersed into the etch solution with an upward force applied to the ring. The amount of force required to break the liquid surface relates to the surface tension of the liquid.

The compositions were also subjected to a foaming test. 30 mls of each composition was added to a 100 mls stoppered measuring cylinder. The cylinder was vigorously shaken for 30 seconds and then the time taken for the foam to disappear or the height of the foam remaining after 5 minutes was recorded. The temperature of all compositions was 20° C. (Compared to the Ross-Miles Foaming Test ASTM Method D 1173-53, it is considered that the above method more closely corresponds to the practical conditions encountered by a composition in a continuous pump recirculation tank operating at a flow rate of 5 to 15 liters/minute).

In the Examples, the following surfactants were used:

EXAMPLE 1—1,5-dimethylhexylamine (primary branched chain)

EXAMPLE 2—octylamine (primary straight chain)

EXAMPLE 3—dodecylamine (primary straight chain)

EXAMPLE 4—2-ethylhexylamine (primary branched chain)

EXAMPLE 5—N,N-dimethyldodecylamine (tertiary straight chain)

EXAMPLE 6—no surfactant was used.

The results are shown in Table 1.

2-ethylhexylamine and 1,5-dimethylhexylamine demonstrated surprisingly low foaming characteristics, with foams which collapsed rapidly.

Octylamine demonstrated high foaming characteristics, with a persistent foam remaining after 10 minutes.

N,N-dimethyl dodecylamine demonstrated lower foaming characteristics than octylamine but greater foaming characteristics than 2-ethylhexylamine and 1,5-dimethylhexylamine.

Dodecylamine is a solid at room temperature. On addition to the etchant composition, the compound remained as a solid and did not go into solution.

The compositions of Examples 2 and 4 (700 ppm) were subjected to an on-line evaluation in a recirculation tank. The compositions were pumped through the system for several hours. The 2-ethylhexylamine-containing composition produced substantially no foam, whereas the octylamine-containing composition produced a high and very stable foam.

TABLE 1

| | ETCHANT (% BY WT) | | | SURFACTANT | SURFACE TENSION (DYNES/CM) | | |
|---|---|---|---|---|---|---|---|
| | HF | NH$_4$F | H$_2$O | (ppm) | AFTER PREP | AFTER FILTER | AFTER 3 MONTH STORAGE |
| EXAMPLE 1 | 1.2 | 35.3 | 63.5 | 700 | 30 | 30 | |
| | | | | 350 | 35 | 35 | |
| | | | | 140 | 45 | 45 | |
| EXAMPLE 2 | 1.2 | 35.3 | 63.5 | 700 | 25 | 25 | |
| | | | | 350 | 25 | 25 | |
| | | | | 140 | 28 | 28 | |
| EXAMPLE 3 | 1.2 | 35.3 | 63.5 | 700 | | | |
| | | | | 350 | | | |
| | | | | 140 | | | |
| EXAMPLE 4 | 1.2 | 35.3 | 63.5 | 700 | 32 | 32 | 32 |
| | | | | 350 | 38 | 38 | 38 |
| | | | | 140 | 47 | 47 | 47 |
| EXAMPLE 5 | 1.2 | 35.3 | 63.5 | 700 | 27 | 27 | |
| | | | | 350 | 27 | 27 | |
| | | | | 140 | 27 | 27 | |
| EXAMPLE 6 | 1.2 | 35.3 | 63.5 | 0 | 85 | 85 | 85 |

TABLE 1-continued

| | SURFACE TENSION (DYNES/CM) AFTER 9 MONTH STORAGE | FOAMING | APPEARANCE |
|---|---|---|---|
| EXAMPLE 1 | 31 | NONE AFTER 90 SECS | TRANSPARENT |
| | 38 | NONE AFTER 45 SECS | " |
| | 48 | NONE AFTER 30 SECS | " |
| EXAMPLE 2 | 25 | 40 MLS AFTER 5 MINS | " |
| | 26 | 40 MLS AFTER 5 MINS | " |
| | 30 | 30 MLS AFTER 5 MINS | " |
| EXAMPLE 3 | | | PRECIPITATE |
| | | | " |
| | | | " |
| EXAMPLE 4 | 32 | NONE AFTER 30 SECS | TRANSPARENT |
| | 38 | NONE AFTER 25 SECS | " |
| | 47 | NONE AFTER 15 SECS | " |
| EXAMPLE 5 | 29 | 10 MLS AFTER 5 MINS | SLIGHTLY |
| | 29 | 5 MLS AFTER 5 MINS | CLOUDED |
| | 28 | 2.5 MLS AFTER 5 MINS | |
| EXAMPLE 6 | 85 | NONE | TRANSPARENT |

I claim

1. An aqueous composition for etching and cleaning semiconductor devices comprising at least one acid and a surfactant, characterised in that the composition comprises from 100 ppm to 2000 ppm of a surfactant which is a branched chain aliphatic amine having the formula $C_mH_{2m+3}N$, where m is an integer from 7 to 10.

2. An aqueous composition as claimed in claim 1, wherein the composition comprises from 150 ppm to 1500 ppm of the surfactant.

3. An aqueous composition as claimed in claim 1, wherein the composition comprises from 250 ppm to 1600 ppm of the surfactant.

4. An aqueous composition as claimed in claim 1, wherein the composition comprises from 250 ppm to 1200 ppm of the surfactant.

5. A composition as claimed in claim 1, wherein the branched chain aliphatic amine is a primary, secondary or tertiary amine having the formula $C_8H_{19}N$.

6. A composition as claimed in claim 5, wherein the branched chain aliphatic amine is a member selected from the group consisting of 1methylheptylamine, 2-ethylhexylamine, dibutylamine, N,N-diisopropylethylamine, and mixtures thereof.

7. An aqueous composition for etching and cleaning semiconductor devices as claimed in claim 1 comprising 15% to 40% by wt ammonium fluoride and 0.5% to 11% by wt hydrogen fluoride.

8. An aqueous composition for etching and cleaning semiconductor devices as claimed in claim 1 comprising 60% to 80% by wt phosphoric acid and optionally one or more acids selected from the group consisting of nitric acid, in an amount of up to 6% by wt, acetic acid, in an amount of up to 15% by wt, and hydrofluoric acid, in an amount of up to 5% by wt.

9. An aqueous composition for etching and cleaning semiconductor devices as claimed in claim 1 comprising 15% to 75% by wt ammonium fluoride and 10% to 35% by wt acetic acid, and optionally hydrofluoric acid, in an amount of up to 5% by wt.

10. A method of making an aqueous acidic etchant composition that does not suffer from significant foaming, the method comprising, using a branched chain aliphatic amine having the formula $C_mH_{2m+3}N$, wherein m is an integer from 7 to 10, as a surfactant in said aqueous acid etchant composition.

11. The method of claim 10 wherein the branched chain aliphatic amine is a primary, secondary or tertiary amine having the formula $C_8H_{19}N$.

12. The method of claim 10 wherein the branched chain aliphatic amine is a member selected from the claim group consisting of 1-methylheptylamine, 2-ethylhexylamine, dibutylamine, N,N-diisopropylethylamine, and mixtures thereof.

13. The method of claim 10, wherein the surfactant is used in an amount of from 100 ppm to 2000 ppm based upon the weight of the etchant composition.

14. The method of claim 10, wherein the etchant composition comprises (a) 15% to 40% by wt ammonium fluoride and 0.5% to 11% by wt hydrogen fluoride; (b) 60% to 80% by wt phosphoric acid and optionally one or more acids selected from the group consisting of nitric acid, in an amount of up to 5% by wt, acetic acid, in an amount of up to 15% by wt, and hydrofluoric acid, in an amount of up to 5% by wt; or (c) 15% to 75% by wt ammonium fluoride and 10% to 35% by wt acetic acid, and optionally hydrofluoric acid, in an amount of up to 5% by wt.

* * * * *

UNITED STATES PATENT AND TRADEMARK OFFICE
CERTIFICATE OF CORRECTION

PATENT NO. : 5,496,485
DATED : March 5, 1996
INVENTOR : David Maternaghan

It is certified that error appears in the above-identified patent and that said Letters Patent is hereby corrected as shown below:

Column 2, line 27, "$C_mH_{2+3}N$," should be --$C_mH_{2m+3}N$,--.

Column 2, line 57, "$C_8H_9N$." should be --$C_8H_{19}N$.--.

Column 5, line 16, "NONE AFTER 25 SECS" should be --NONE AFTER 20 SECS--.

Column 5, line 45, "1methylheptylamine," should be --1-methylheptylamine,--.

Signed and Sealed this

Fifteenth Day of October, 1996

Attest:

BRUCE LEHMAN

Attesting Officer

Commissioner of Patents and Trademarks